United States Patent
Zhao et al.

(10) Patent No.: US 9,287,268 B2
(45) Date of Patent: Mar. 15, 2016

(54) DYNAMIC RANDOM ACCESS MEMORY (DRAM) AND PRODUCTION METHOD, SEMICONDUCTOR PACKAGING COMPONENT AND PACKAGING METHOD

(71) Applicant: GalaxyCore Shanghai Limited Corporation, Shanghai (CN)

(72) Inventors: Lixin Zhao, Shanghai (CN); Junqiang Lan, Shanghai (CN); Tao Zhang, Shanghai (CN)

(73) Assignee: Galaxycore Shanghai Limited Corporation (CN)

( * ) Notice: Subject to any disclaimer, the term of this patent is extended or adjusted under 35 U.S.C. 154(b) by 0 days.

(21) Appl. No.: 14/435,677

(22) PCT Filed: Jun. 24, 2014

(86) PCT No.: PCT/CN2014/080570
§ 371 (c)(1),
(2) Date: Apr. 14, 2015

(87) PCT Pub. No.: WO2015/003553
PCT Pub. Date: Jan. 15, 2015

(65) Prior Publication Data
US 2015/0263005 A1    Sep. 17, 2015

(30) Foreign Application Priority Data

Jul. 10, 2013   (CN) .......................... 2013 1 0289419

(51) Int. Cl.
| | |
|---|---|
| *H01L 21/48* | (2006.01) |
| *H01L 21/66* | (2006.01) |
| *H01L 27/108* | (2006.01) |
| *H01L 21/00* | (2006.01) |
| *H01L 25/065* | (2006.01) |
| *H01L 25/00* | (2006.01) |
| *H01L 23/31* | (2006.01) |
| *H01L 23/00* | (2006.01) |

(52) U.S. Cl.
CPC .............. *H01L 27/108* (2013.01); *H01L 24/94* (2013.01); *H01L 25/065* (2013.01);
(Continued)

(58) Field of Classification Search
CPC ...... H01L 21/485; H01L 22/22; H01L 27/108
USPC .......................................................... 438/4
See application file for complete search history.

(56) References Cited

U.S. PATENT DOCUMENTS 3,872,291 A * 3/1975 Hunter, II ........... G06F 12/0661
711/E12.086

(Continued)

FOREIGN PATENT DOCUMENTS

| | | |
|---|---|---|
| CN | 102543967 | 7/2012 |
| CN | 102640283 A | 8/2012 |

(Continued)

OTHER PUBLICATIONS

International Search Report (2014) for International Application No. PCT/CN2014/080570.

*Primary Examiner* — David Zarneke
(74) *Attorney, Agent, or Firm* — Swanson & Bratschun, L.L.C.

(57) ABSTRACT

A dynamic random access memory (DRAM) and a production method, a semiconductor packaging component and a packaging method. The production method comprises: providing a memory wafer, the memory wafer being provided with a memory bare chip which is provided with a top metal layer which is provided with a power source bonding pad, a signal bonding pad, and a micro bonding pad, and an internal bus led out of the memory bare chip being electrically connected to the micro bonding pad; repairing the memory wafer; if a yield of the memory wafer is greater than or equal to a preset threshold, rearranging the micro bonding pad to form a butt-joint bonding pad which is electrically connected to the micro bonding pad and the power source bonding pad. A structure of the DRAM is not significantly changed, a data bandwidth of the DRAM is increased, and a high yield is ensured.

20 Claims, 6 Drawing Sheets

(52) U.S. Cl.
CPC ........... *H01L 25/0657* (2013.01); *H01L 25/50* (2013.01); *H01L 21/485* (2013.01); *H01L 22/22* (2013.01); *H01L 23/3107* (2013.01); *H01L 24/16* (2013.01); *H01L 24/48* (2013.01); *H01L 24/81* (2013.01); *H01L 27/10897* (2013.01); *H01L 2224/16148* (2013.01); *H01L 2224/48245* (2013.01); *H01L 2224/81193* (2013.01); *H01L 2224/81201* (2013.01); *H01L 2224/94* (2013.01); *H01L 2225/06513* (2013.01); *H01L 2225/06524* (2013.01); *H01L 2924/12042* (2013.01)

(56) References Cited

U.S. PATENT DOCUMENTS

| | | | |
|---|---|---|---|
| 5,103,557 A * | 4/1992 | Leedy | G01R 1/07307 257/E21.526 |
| 5,422,850 A * | 6/1995 | Sukegawa | G11C 29/70 326/13 |
| 5,841,784 A * | 11/1998 | Chan | G11C 29/48 714/31 |
| 6,214,630 B1 | 4/2001 | Hsuan | |
| 6,233,184 B1 | 5/2001 | Barth | |
| 6,399,975 B1 | 6/2002 | Cheong | |
| 8,455,936 B2 | 6/2013 | O'Neill | |
| 2008/0116544 A1 | 5/2008 | Grinman | |
| 2011/0204917 A1 | 8/2011 | O'Neill | |
| 2015/0050781 A1 | 2/2015 | Guzek | |

FOREIGN PATENT DOCUMENTS

| | | |
|---|---|---|
| CN | 202905697 U | 4/2013 |
| CN | 103366798 | 10/2013 |
| CN | 203325472 | 12/2013 |
| GB | 2349249 A | 10/2000 |
| JP | 2000-207896 A | 7/2000 |
| TW | 459238 | 10/2001 |

* cited by examiner

DYNAMIC RANDOM ACCESS MEMORY (DRAM) AND PRODUCTION METHOD, SEMICONDUCTOR PACKAGING COMPONENT AND PACKAGING METHOD

CROSS-REFERENCE TO RELATED APPLICATIONS

The present application is a Section 371 National Stage Application of International Application No. PCT/CN2014/080570, filed on Jun. 24, 2014, which claims priority to Chinese patent application No. 201310289419.9, filed on Jul. 10, 2013, and entitled "DYNAMIC RANDOM ACCESS MEMORY AND FORMING METHOD THEREOF, AND SEMICONDUCTOR PACKAGE COMPONENT AND PACKAGING METHOD THEREOF", and the entire disclosure of which is incorporated herein by reference.

TECHNICAL FIELD

The present disclosure generally relates to semiconductor field, and more particularly, to a dynamic random access memory and a forming method thereof, and a semiconductor package component and a packaging method thereof.

BACKGROUND

Dynamic Random Access Memories (DRAMs) are widely used due to many advantages, such as large capacity, high speed and low cost. Nowadays, DRAMs have been developed to have various types. For example, in high performance applications, the first-generation DDR (Double Data Rate) has been developed to the fifth-generation DDR5. In low power consumption applications, LPDDR (Low Power Double Data Rate) has been developed to LPDDR2.

FIG. 1 illustrates a structural diagram of a common DRAM in existing techniques. Referring to FIG. 1, the DRAM includes a memory array 10, a control logic circuit 20 and an interface conversion logic circuit 30. The memory array 10, which occupies a largest area in the DRAM, includes plenty of memory cells configured to store data. Generally, a memory array can be divided into a plurality of banks with the same size and structure. As shown in FIG. 1, the memory array includes eight banks, each of which has its own data bus and control bus that are independent from those of other banks. In some occasions, there may be a set of banks sharing one data bus and one control bus which are independent from data buses and control buses shared by other sets. The control logic circuit 20 includes a plurality of circuits, such as a memory array control circuit, a row address latch circuit, a column address latch and a bit selection logic circuit. The control logic circuit 20 is configured to control operations of the DRAM, process DRAM protocol, and convert writing and reading request on a DRAM interface into access to each bank. The interface conversion logic circuit 30 is used for data serial-to-parallel conversion. As the DRAM needs to use a relatively narrow data bus interface to reduce Printed Circuit Board (PCB) wiring difficulty and improve reliability of the memory system, the interface conversion logic circuit 30 is configured to convert a data bus which is connected with banks and has relatively great data width into a data bus on the DRAM interface which has relatively small data width. However, the interface conversion logic circuit 30 may cause greater power consumption, and the smaller data bus width may restrain the improvement on DRAM reading rate.

To obtain a wider DRAM data bus, those skilled in the art have developed DRAM packaging methods from Thin Shrink Small Outline Package (TSSOP) to Ball Grid Array (BGA) package and stacked package. In one existing solution, a DRAM data bus having ultra-wide data width is used in a die-to-die package method (namely, bonding and connecting two dies at a time successively), which greatly increases data width of DRAM and reduces power consumption. However, in the above solution, a structure and package of the DRAM needs to be modified greatly, thus, it is not compatible with a DRAM commonly used in these days. That is to say, it is quite difficult to popularize the above solution.

Another existing technique is provided, called wafer-to-wafer package. In wafer-to-wafer package, two wafers with the same size are bonded directly, where sizes of logic regions and distribution patterns of pins on the two wafers should be identical. When the bonding is completed, the logic regions on the two wafers are connected to each other. Single chip pairs are formed after the bonded wafers are sliced, each single chip pair includes two chips connected to each other. In this package method, the chips on the two wafers are connected to each other correspondingly in one step, which is different from the die-to-die package where only two chips are connected to each other in one step and chip pairs are formed successively. Therefore, cost is reduced in the wafer-to-wafer package.

However, a wafer-to-wafer package method leads to a low yield. Since each chip pair has two chips respectively on the two wafers, to ensure the chip pair is non-defective, each of the two chips is required to be non-defective. If either of the two wafers has a low yield, it may lead to a decrease of the yield of chip pairs formed by bonding and connecting the two wafers. For example, a DRAM wafer and a System on Chip (SoC) wafer are used in wafer-level package. Assuming a yield of the SoC wafer is 98% and a yield of the DRAM wafer is 90%, then a yield of chip pairs after package is 0.98*0.9=88.2%. The yield (88.2%) is acceptable, because not many qualified Soc chips are wasted. Considering the cost reduce brought by the wafer-to-wafer package, the yield loss is reasonable in this case. For another example, the yield of the DRAM wafer is 60%, thus, the yield of chip pairs after package is 58.8%, which leads to a great waste of qualified SoC chips.

More related information can be found in Chinese patent publication No. CN102543967A.

SUMMARY

In embodiments of the present disclosure, a DRAM has a structure which is formed based on little modification to a current DRAM structure, data width of the DRAM may be increased, and a yield of DRAM may be improved.

In an embodiment, a method for forming a DRAM is provided, including: providing a memory wafer, where memory dies are formed on the memory wafer, a top metal layer is formed above the memory dies, power source pads, signal pads and micro pads are formed on the top metal layer, and an internal bus is led out from the memory dies to be electrically connected with the micro pads; repairing the memory wafer; after the repair, if a yield of the memory wafer is greater than or equal to a predetermined threshold, redistributing the micro pads to form bonding pads which are electrically connected with the micro pads and the power source pads.

In some embodiments, the predetermined value may be 70% to 90%.

In some embodiments, the memory dies may include a plurality sets of internal buses, where each set of the internal bus includes a data bus and a control bus, and each set of the internal bus corresponds to one set or a plurality sets of memory arrays in the memory dies.

In some embodiments, each set of the internal bus may have a data width greater than or equal to 64 bits.

In some embodiments, an area of the bonding pads may be greater than an area of the micro pads.

In some embodiments, the number of the bonding pads may be greater than or equal to a sum of the number of the micro pads and the number of the power source pads.

In some embodiments, each of the micro pads may be connected with at least one of the bonding pads.

In some embodiments, each of the power source pads may be connected with at least one of the bonding pads.

In some embodiments, redistributing the micro pads to form the bonding pads may include: forming at least one metal layer above the memory wafer; forming the bonding pads on a top one of the at least one metal layer, where the number and positions of the bonding pads are corresponding to the number and positions of bonding pads on a logic chip; and electrically connecting the bonding pads on the top one of the at least one metal layer with the micro pads and the power source pads.

In some embodiments, the method may further include: turning off at least one selected from a physical interface logic, a serial-to-parallel conversion logic, a mode register and a delay phase-locked loop.

In some embodiments, the method may further include: forming a test logic chip in a slicing groove of the memory wafer, the test logic chip being connected with the bonding chips.

In some embodiments, the method may further include: if the yield of the memory wafer is less than the predetermined threshold, slicing the memory wafer to separate the memory dies; and packaging the memory dies individually.

In an embodiment, a DRAM, formed on a memory wafer, is provided, including: a memory die, which includes a plurality sets of memory arrays and a plurality sets of internal buses, each set of the internal bus corresponding to at least one set of the memory arrays; power source pads, signal pads and micro pads formed on the memory die; bonding pads formed above the power source pads and the micro pads, where the bonding pads are connected with the power source pads and the micro pads, and the plurality sets of internal buses are connected with the micro pads.

In some embodiments, a yield of the DRAM may be greater than or equal to a predetermined threshold.

In some embodiments, the predetermined value may be 70% to 90%.

In some embodiments, each set of the internal bus may have a data width greater than or equal to 64 bits.

In some embodiments, an area of the bonding pads may be greater than an area of the micro pads.

In some embodiments, the number of the bonding pads is greater than or equal to a sum of the number of the micro pads and the number of the power source pads.

In some embodiments, each of the micro pads may be connected with at least one of the bonding pads.

In some embodiments, each of the power source pads may be connected with at least one of the bonding pads.

In some embodiments, the number and positions of the bonding pads may be corresponding to the number and positions of bonding pads on a logic chip.

In an embodiment, a semiconductor package method is provided, including: providing a first wafer which has DRAMs formed thereon, where the DRAMs are formed by any one of the above methods; providing a second wafer which has logic chips formed thereon, where the logic chips include bonding pads which are corresponding to bonding pads in the DRAMs; and electrically connecting the bonding pads in the DRAMs with the bonding pads on the logic chips to form wafer-level package of the first and second wafers.

In some embodiments, electrically connecting the bonding pads in the DRAMs with the bonding pads on the logic chips to form wafer-level package of the first and second wafers may include: bonding and connecting the bonding pads in each DRAM on the first wafer with the bonding pads on each logic chip on the second wafer correspondingly.

In some embodiments, the method may further include: after realizing the wafer-level package, slicing the first and second wafers to obtain semiconductor interconnection components which include the DRAMs and the logical chips; and packaging the semiconductor interconnection components to form semiconductor package components, respectively.

In an embodiment, a semiconductor package component is provided, including: any one of the above DRAMs; and a logic chip which includes bonding pads, where the bonding pads of the logic chip are corresponding to and electrically connected with bonding pads in the DRAM Compared with existing techniques, embodiments of the present disclosure have advantages as follows.

Compared with current DRAMs, structures of the DRAM provided in embodiments of the present disclosure haven't changed a lot, merely by leading its bank-level ultra wide bus out to its chip surface and forming micro pads. When the yield of the memory wafer reaches a predetermined value, these micro pads will be redistributed to facilitate bonding the DRAM chip with a SoC chip, so that the SoC chip can read and write data from the DRAM's memory array directly through the ultra-wide bus. Therefore, data width of the data bus may be increased greatly, and power consumption caused by high-rate serial-to-parallel conversion may be avoided.

Further, an interface conversion logic and pads, normally contained in the current DRAM, are remained in the DRAM of the present disclosure, thus, when the yield of the DRAM wafer is relatively low, the DRAM wafer is sliced, which ensures DRAM dies still can be used in conventional package processes to form DRAM chips in an original way. Therefore, qualified SoC chips won't be wasted. The DRAM provided in embodiments of the present disclosure may be used as a conventional DRAM or as a DRAM having ultra-wide buses, which may reduce a risk and cost of evolution from existing DRAM technology to new technology.

Further, when the DRAM operates in an ultra-wide bus mode, some logic circuits may be turned off to further reduce energy consumption. These logic circuits are used in conventional package methods which are employed only when the yield is relatively low.

DETAILED DESCRIPTION

In the following description, for the purposes of explanation, numerous specific details are set forth in order to provide a thorough understanding of the present disclosure. It will be apparent, however, to those skilled in the art that the present disclosure may be practiced with other embodiments different from embodiments described below. Accordingly, the present disclosure is not limited to the embodiments described.

Besides, embodiments of present disclosure will be described in detail in conjunction with accompanying drawings. The drawings as examples are not used to limit the scope of the present disclosure.

In the accompanying drawings, shapes of components may be drawn exaggeratedly for clarity. A same numeral represents a same component. It should be noted that, when it is described that a layer is formed on another layer or on a substrate, it indicates that the layer is formed on the another layer or the substrate directly or there are other layers between the layer and the another layer or the substrate.

To solve technical problems described in background, a method for forming a DRAM is provided.

Figure 1:
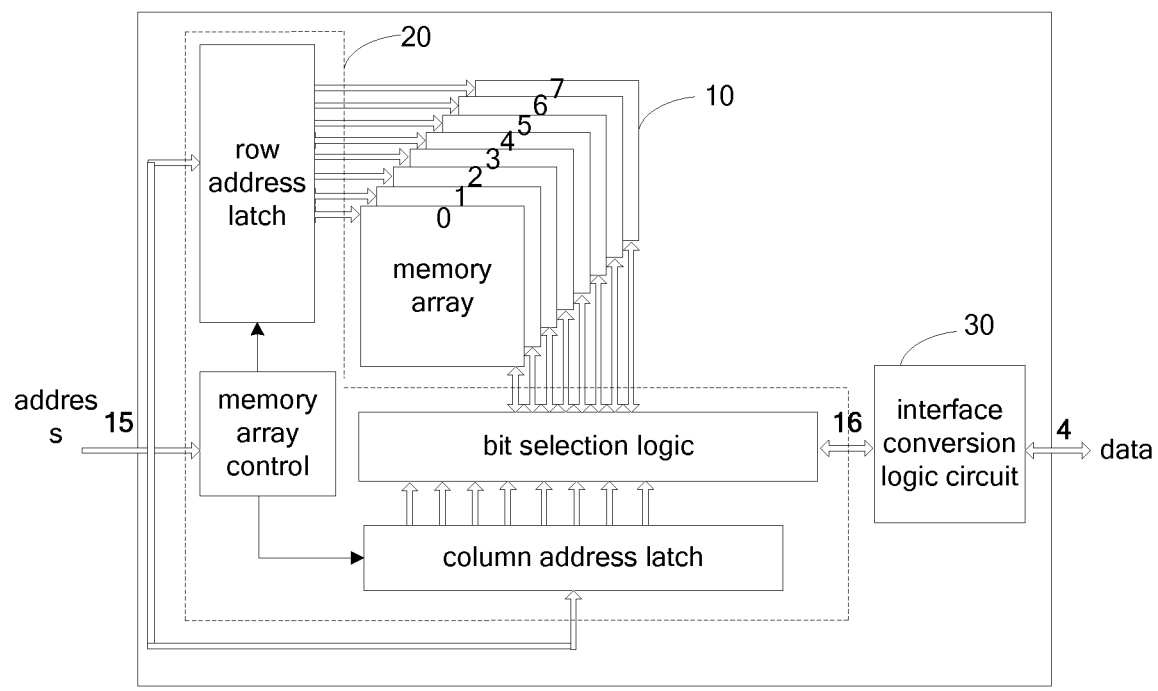
FIG. 1 illustrates a structural diagram of a DRAM in existing techniques.
Figure 2:
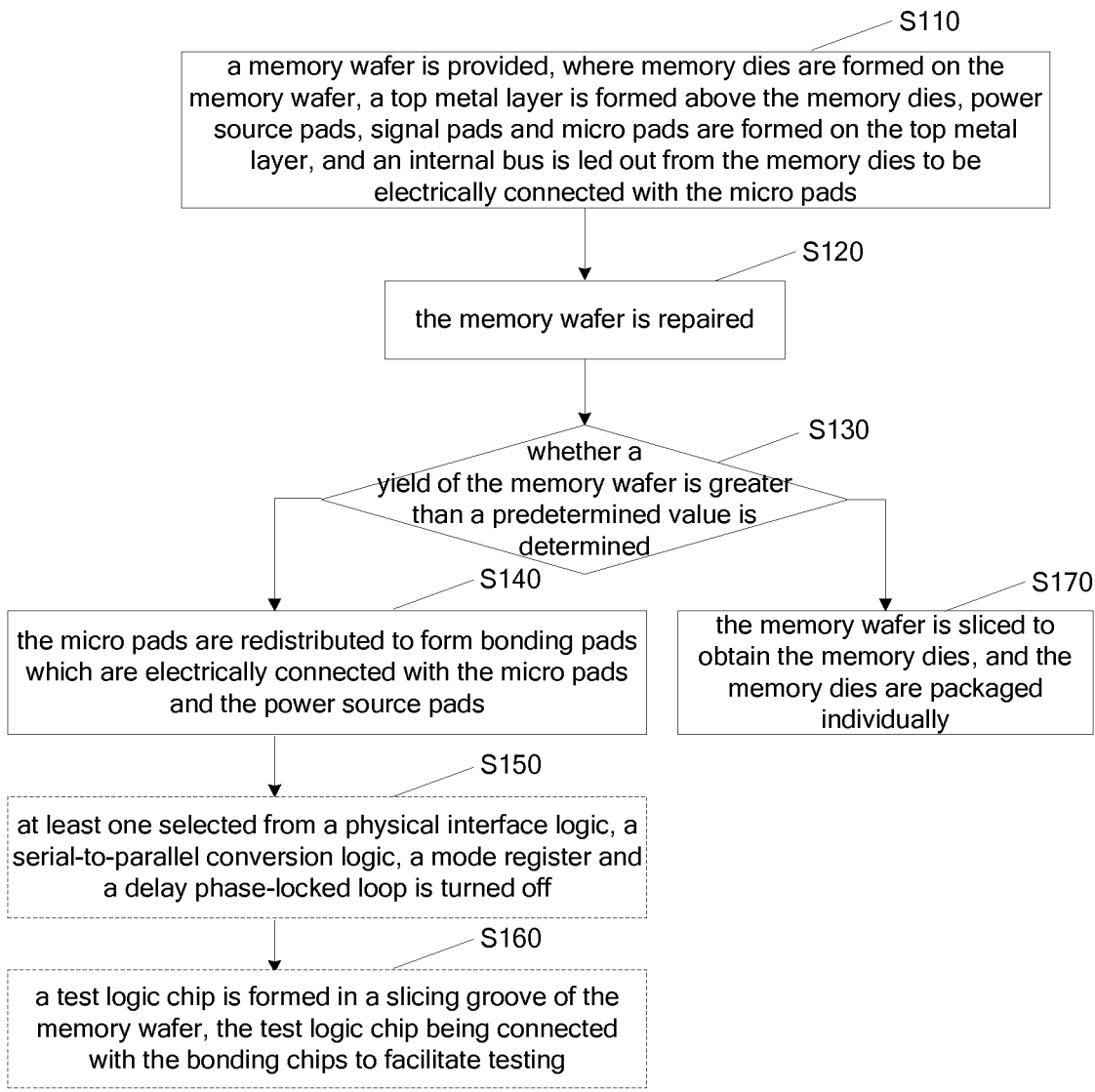
FIG. 2 illustrates a flow chart of a method for forming a DRAM according to a first embodiment.

FIG. 2 illustrates a flow chart of a method for forming a DRAM according to a first embodiment. Referring to FIG. 2, the method includes steps S110 to S170.

In S110, a memory wafer is provided, where memory dies are formed on the memory wafer, a top metal layer is formed above the memory dies, power source pads, signal pads and micro pads are formed on the top metal layer, and an internal bus is led out from the memory dies to be electrically connected with the micro pads.

In some embodiments, the memory dies may include a plurality sets of internal buses, where each set of the internal bus includes a data bus and a control bus, the internal buses are connected with memory arrays in the memory dies and have relatively great data width. In some embodiments, the internal buses may have data width greater than or equal to 64 bits. Each set of the internal bus is connected with at least one set of memory array in the memory dies. In some embodiments, to improve the reliability and a reuse rate of DRAM, each set of the internal bus is connected with a plurality sets of memory arrays in the memory dies.

In the first embodiment, at least one metal layer is formed on the memory dies, micro pads are formed in the top metal layer, and the internal buses having great data width are led out from the memory arrays in the memory dies to be electrically connected with the micro pads.

In some embodiments, power source pads and signal pads in a conventional DRAM package are still used. The power source pads are adapted to provide power to the DRAM. The signals pads are adapted to realize writing and reading of DRAM through a conventional interface control logic circuit. The micro pads are adapted to lead out the internal buses to a surface of the DRAM. Each of the micro pads may be connected with at least one of the internal buses. To improve the reliability and a reuse rate of DRAM, in some embodiments, each micro pad may be connected with a plurality of internal buses.

In S120, the memory wafer is repaired. Methods for repairing the memory wafer are not limited in embodiments of the present disclosure. There are many existing methods, such as laser trimming, can be used to repair the memory wafer. After the repair, a yield of the memory wafer may be improved.

In S130, whether a yield of the memory wafer is greater than a predetermined value is determined. In some embodiments, the predetermined value is relatively small, thus, the formed DRAM may be determined to have a relatively low yield. If a yield of a wafer which has SoC formed thereon is relatively high, a great waste of the wafer may be caused. In some embodiments, the predetermined value is relatively great, thus, to enable the formed DRAM to have a high yield, requirements on using the method for forming the DRAM is relatively strict, that is to say, the method may not be applied widely. In some embodiments, the predetermined value may be within a range from 70% to 90%.

Still referring to FIG. 2, if the yield of the memory wafer is greater than or equal to the predetermined value, S140 is executed. In S140, the micro pads are redistributed to form bonding pads which are electrically connected with the micro pads and the power source pads.

Reasons for redistributing the micro pads are described as follows. The micro pads are relatively small, which goes against connection between the DRAM wafer and the SoC wafer. Further, positions of the micro pads should be corresponding to positions of bonding pads on the SoC, which may increase difficulty in designing DRAM chips. Therefore, in some embodiments, the micro pads may be redistributed to form the bonding pads above the micro pads, which may improve the above problems.

In some embodiments, redistributing the micro pads to form the bonding pads may include: forming at least one metal layer on the memory wafer; forming the bonding pads on a top one of the at least one metal layer, where the number and positions of the bonding pads are corresponding to the number and positions of bonding pads on a logic chip; and electrically connecting the bonding pads on the top one of the at least one metal layer with the micro pads and the power source pads.

It should be noted that, in some embodiments, the writing and reading of DRAM is not realized based on a conventional interface conversion logic circuit, thus, the signal pads are not needed in subsequent package processes. Accordingly, the bonding pads do not need to be electrically connected with the signal pads.

To facilitate connecting the DRAM wafer with the SoC wafer, an area of the bonding pads may be greater than an area of the micro pads.

In some embodiments, the number of the bonding pads may be at least equal to a sum of the number of the micro pads and the number of the power source pads. In some embodiments, to improve the reliability of the DRAM, more bonding pads may be formed, that is, the number of the bonding pads may be greater than the sum of the number of the micro pads and the number of the power source pads. In some embodiments, each of the micro pads may be connected with at least one of the bonding pads, and each of the source pads may be connected with at least one of the bonding pads.

Still referring to FIG. 2, optionally, S150 may be performed after S140. In S150, at least one selected from a physical interface logic, a serial-to-parallel conversion logic, a mode register and a delay phase-locked loop is turned off. The physical interface logic, the serial-to-parallel conversion logic, the mode register and the delay phase-locked loop are required when a DRAM is written and read through an interface conversion logic circuit. When the DRAM operates in an ultra-wide bus mode, these components may be turned off to reduce energy consumption.

Still referring to FIG. 2, optionally, S160 may be performed. In S160, a test logic chip is formed in a slicing groove of the memory wafer, the test logic chip being connected with the bonding chips to facilitate testing.

Still referring to FIG. 2, if the yield of the memory wafer is less than the predetermined threshold, S170 is performed. In S170, the memory wafer is sliced to separate the memory dies, and the memory dies are packaged individually. In embodiments of the present disclosure, an interface conversion logic and signal pads are remained in the DRAM, thus, when the yield of the DRAM wafer is relatively low, the DRAM wafer still can be sliced, which ensures DRAM chips to be formed according to conventional package methods.

Compared with current DRAMs, structures of the DRAM provided in embodiments of the present disclosure haven't changed a lot, merely by increasing data bus width of the DRAM, which enables the DRAM to be used as a DRAM having ultra-wide buses, or as a conventional DRAM when the yield of the DRAM wafer is relatively low, and this further reduces a risk and cost of evolution from existing DRAM technology to new technology, ensures an ideal yield, and reduces manufacturing cost.

A method for forming a DRAM is provided according to a second embodiment.

Figure 3:
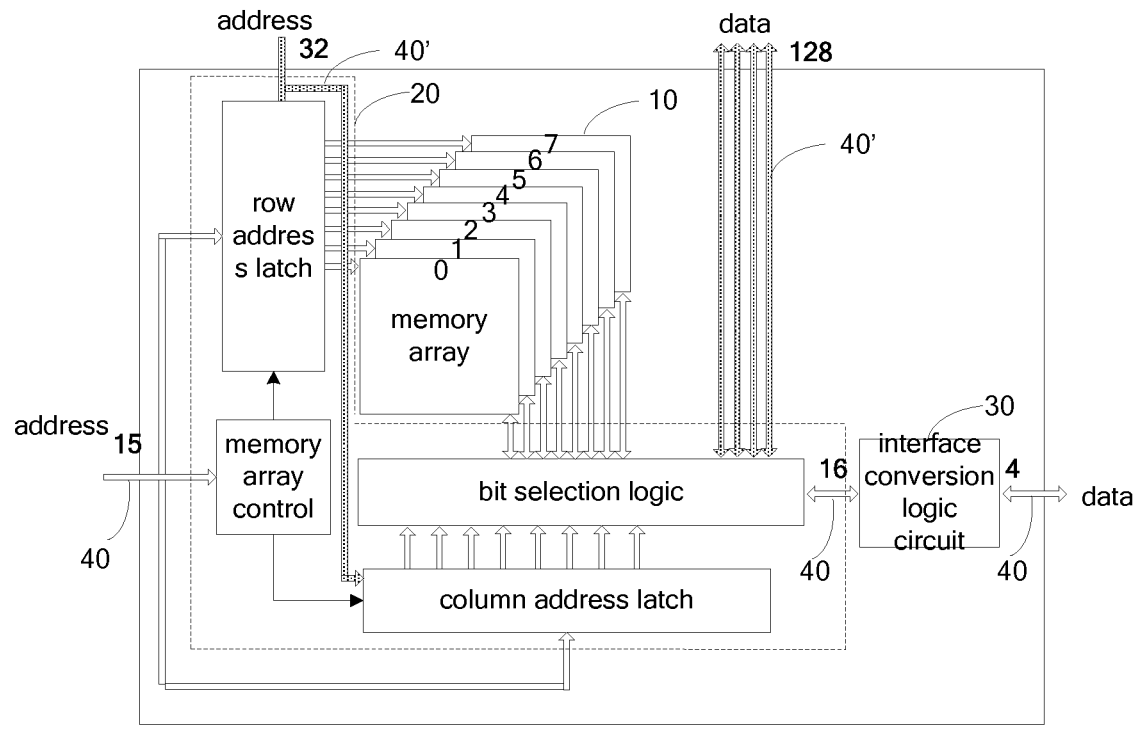
FIG. 3 illustrates a structural diagram of a memory die used in a method for forming a DRAM according to a second embodiment.

FIG. 3 illustrates a structural diagram of a memory die used in the method for forming the DRAM according to the second embodiment. Referring to FIG. 3, the memory die includes a memory array 10, a control logic circuit 20, an interface conversion logic circuit 30, an original bus 40 and an ultra-wide bus 40'.

The memory array 10 includes eight banks (banks 0 to 7) configured to store data.

The control logic circuit 20 includes a row address latch circuit, a memory array control circuit, a column address latch, and a bit selection logic circuit, and is configured to control the memory array to realize writing and reading operation of certain memory cells in the banks.

The interface conversion logic circuit 30 is configured to perform serial-to-parallel conversion on data read from the banks, and transmit the converted data through a certain interface. A data bus through the interface conversion logic circuit 30 may have decreased width.

The original bus 40 includes an original address bus and an original data bus. Referring to FIG. 3, generally, the original address bus has width of 15 bits, and the original data bus has width of 4 bits, 8 bits or 16 bits. In some embodiments, before the serial-to-parallel conversion by the interface conversion logic circuit 30, the original data bus has width of 16 bits. After the serial-to-parallel conversion by the interface conversion logic circuit 30, the original data bus has width decreased to 4 bits. The original data bus after the serial-to-parallel conversion is connected to the signal pads (not shown in figures) to satisfy requirements of conventional DRAM package.

The ultra-wide bus 40' includes an ultra-wide address bus and an ultra-wide data bus, which are used for realizing the method for forming the DRAM having an ultra-wide bus in embodiments of the present disclosure. Referring to FIG. 3, the ultra-wide bus 40' has width greater than that of the original bus 40. In some embodiments, the ultra-wide address bus may have a plurality of branches (such as branch 2, branch 4, branch 8, etc. In this embodiment, one branch is illustrated for example). Each of the plurality of branches may have width of 32 bits. In some embodiments, the ultra-wide data bus may have a plurality of branches as well. Each of the plurality of branches may have width of 64 bits, 128 bits, 256 bits, or other greater values. In some embodiments, the ultra-wide data bus has width of 128 bits. The ultra-wide data bus does not pass through the interface conversion logic circuit 30. The ultra-wide data bus along with the ultra-wide address bus is directly connected with the micro pads (not shown in figures) to form the DRAM having ultra-wide buses.

In some embodiments, when requirements on the yield of the memory wafer cannot be satisfied, conventional methods for forming a DRAM may be employed.

In some embodiments, an operating process of the DRAM may include following steps. An address of a memory cell which needs to write or read data is transmitted to the memory array control circuit through the original address bus. The memory array control circuit analyzes the address to form a row address and a column address, and transmits the row address and the column address to the row address latch circuit and the column address latch circuit, respectively. Afterwards, the row address latch circuit selects a row of a bank in the memory array by the original address bus according to the row address. The column address latch circuit selects a column in the selected row by the bit selection logic circuit according to the column address, thus, a memory cell defined by the selected row and column is selected. Writing or reading operation is performed to the memory cell. And data in the memory cell is transmitted to the interface conversion logic circuit 30 through the original data bus having relatively great width (16 bits) to perform serial-to-parallel conversion. After the serial-to-parallel conversion, the data is transmitted to an external interface (i.e., signal pads) of the DRAM through the original data bus having relatively small width (4 bits).

If the yield of the memory wafer meets the requirements, the methods for forming the DRAM in embodiments of the present disclosure may be employed to form DRAMs having ultra-wide data buses.

In some embodiments, an operating process of the DRAM may include following steps. An address of a memory cell which needs to write or read data is transmitted to the row address latch circuit and the column address latch circuit directly through the ultra-wide address bus. Afterwards, the row address latch circuit selects a row of a bank in the memory array by the original address bus according to the row address. The column address latch circuit selects a column in the selected row by the bit selection logic circuit according to the column address, thus, a memory cell defined by the selected row and column is selected. Writing or reading operation is performed to the memory cell. And data in the memory cell is transmitted to an external interface (i.e., the micro pads) of the DRAM through the ultra-wide data bus (having width of 128 bits) directly.

Figure 4:
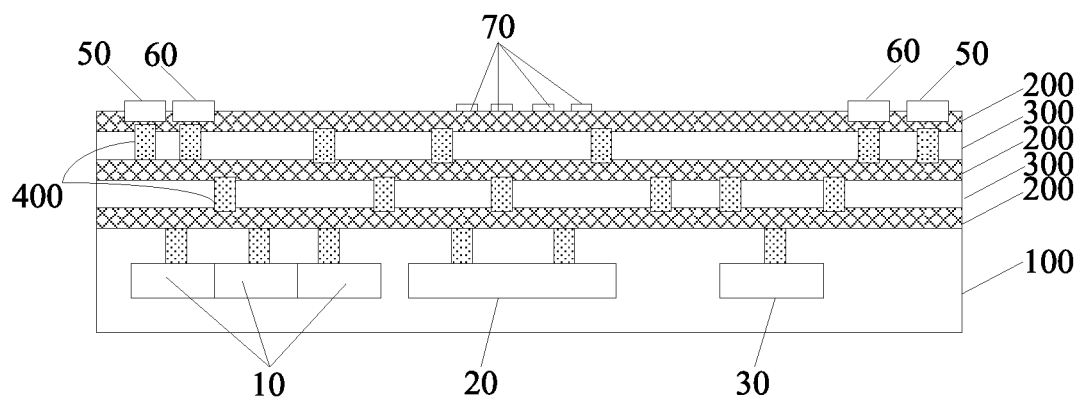
FIG. 4 illustrates a front view of a wafer which has the memory die shown in FIG. 3 formed thereon.

FIG. 4 illustrates a front view of a wafer which has the memory die shown in FIG. 3 formed thereon. Referring to FIG. 4, the memory array 10, the control logic circuit 20 and the interface conversion logic circuit 30 of the memory die are formed in a semiconductor substrate 100 of the wafer. A plurality of metal layers 200 and a plurality of dielectric layer 300 are formed on the semiconductor substrate 100 in turn. As shown in FIG. 4, a first metal layer 200 is formed on the semiconductor substrate 100, a first dielectric layer 300 overlaps the first metal layer 200, a second metal layer 200 overlaps the first dielectric layer 300, a second dielectric layer 300 overlaps the second metal layer 200, and a third metal layer 200 overlaps the second dielectric layer 300. Connection holes 400 are formed between the semiconductor substrate 100 and the metal layer 200, and between the metal layer 200 and the dielectric layer 300, to realize electrical connection between components. Signal pads 50, power source pads 60 and micro pads 70 are formed on the top metal layer 200. The signal pads 50 are electrically connected with the interface conversion logic circuit 30 through the connection hole 400. The micro pads 70 are electrically connected with the control logic circuit 20 through the connection hole 400.

Those skilled in the art can understand that the original bus 40 and the ultra-wide bus 40' are formed in the connection holes 400 (not shown in figures). The signal pads 50 are electrically connected with the interface conversion logic circuit 30 through the original bus 40. The micro pads 70 are electrically connected with the control logic circuit 20 through the ultra-wide bus 40'.

Referring to FIG. 2, the memory wafer is repaired.

In some embodiments, the yield of the memory wafer is greater than or equal to a predetermined value, thus, the method provided in embodiments of the present disclosure may be employed to form the DRAM having ultra-wide buses.

Referring to FIG. 2, the micro pads are redistributed to form bonding pads.

Figure 5A:
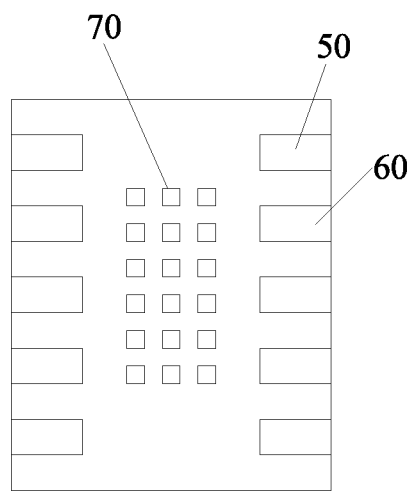
FIGS. 5a and 5b illustrate vertical views of the memory die shown in FIG. 4 before redistribution and after redistribution, respectively.
Figure 5B:
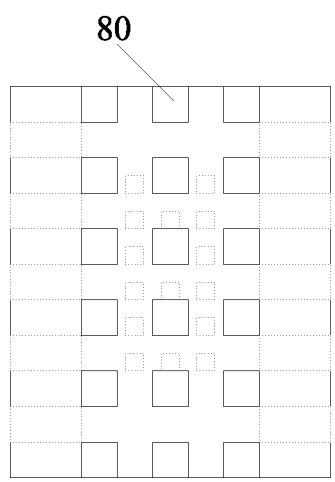

FIGS. 5a and 5b illustrate vertical views of the memory die shown in FIG. 4 before redistribution and after redistribution, respectively.

FIG. 5a illustrates the vertical view of the memory die shown in FIG. 4 before redistribution. Referring to FIG. 5a, the signal pads 50, the power source pads 60 and the micro pads 80 are formed on different positions of a surface of the memory die. The number of the micro pads 70 is relatively greater but an area of the micro pads 70 is relatively small.

FIG. 5b illustrates the vertical view of the memory die shown in FIG. 4 after redistribution. Referring to FIG. 5b, after the redistribution, bonding pads 80 are formed on the surface of the memory die and cover the signal pads 50, the power source pads 60 and the micro pads 70. Obviously, an area of the bonding pads 70 is greater than the area of the micro pads 70. The number and positions of the bonding pads 80 are corresponding to the number and positions of bonding pads on a logic chip. The bonding pads 80 are electrically connected with the micro pads 70 and the power source pads 60.

Figure 6:
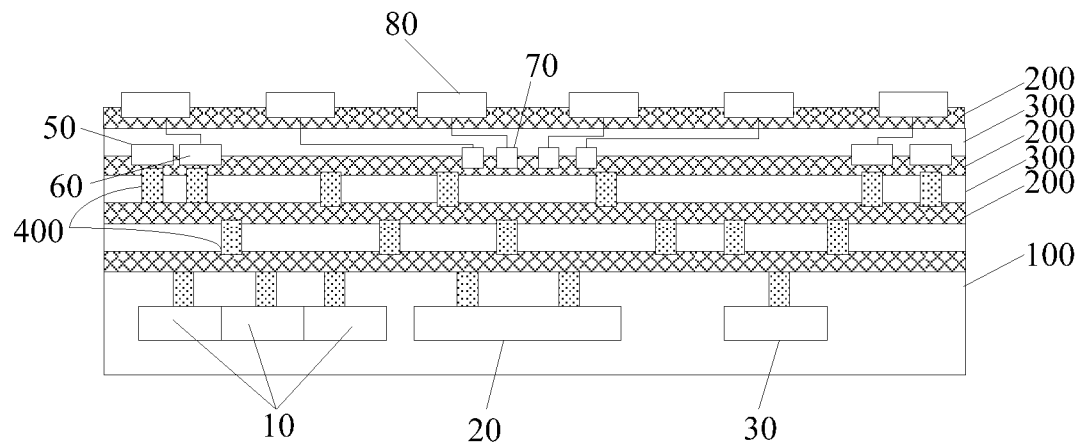
FIG. 6 illustrates a structure formed by the method for forming the DRAM according to the second embodiment.

FIG. 6 illustrates a structure formed by the method for forming the DRAM according to the second embodiment. Referring to FIG. 6, at least one metal layer 200 is formed above the metal layer 200 which has the signal pads 50, the power source pads 60 and the micro pads 70 formed thereon. The bonding pads 80 are formed on the top metal layer 200.

It should be noted that, in some embodiments, each micro pad 70 is connected with one of the bonding pads 80, and each power source pad 60 is connected with one of the bonding pads 80. Those skilled in the art can understand that, to improve reliability of connection, each micro pad 70 or each power source pad 60 may be connected with a plurality of bonding pads 80, so that the DRAM can operate normally when connection between the micro pad 70 and at least one of the plurality of bonding pads 80 or connection between the power source pad 60 and at least one of the plurality of bonding pads 80 is effective.

From above, when the yield of the memory wafer is greater than or equal to the predetermined value, the DRAM having ultra-wide buses can be formed. Those skilled in the art can understand, there are many existing techniques to slice the memory wafer to obtain the memory dies individually, when the yield of the memory wafer is less than the predetermined value. The plurality of single memory dies are packaged individually, such as BGA package, TSSOP package, Chip Scale Package (CSP) and Chip On Board (COB) package, which is not limited in embodiments of the present disclosure and not described in detail here.

Besides, those skilled in the art can understand that, the components which are not required in an operation mode of the DRAM having ultra-wide buses can be turned off by various existing techniques, which is not limited in embodiments of the present disclosure and not described in detail here. The components include the physical interface logic, the serial-to-parallel conversion logic, the mode register, the delay phase-locked loop and etc.

In embodiments of the present disclosure, an interface conversion logic and pads are remained in the DRAM, thus, when the yield of the DRAM wafer is relatively low, a conventional package method may be employed by slicing the DRAM wafer. Thus, the DRAM provided may be used as a conventional DRAM or as a DRAM having ultra-wide buses, which may reduce a risk and cost of evolution from existing DRAM technology to new technology.

Accordingly, in an embodiment, a DRAM is provided. Referring to FIGS. 3 and 6, the DRAM includes a memory die, the signal pads 50, the power source pads 60, the micro pads 70 and the bonding pads 80.

In some embodiments, the memory die includes the memory array 10, the control logic circuit 20, the interface conversion logic circuit 30 and a plurality sets of internal buses.

The plurality sets of internal buses include original buses 40 and ultra-wide buses 40'. The original buses 40 include original address buses and original data buses. The ultra-wide buses 40' include ultra-wide address buses and ultra-wide data buses. The ultra-wide buses 40' have data width greater than that of the original buses 40. In some embodiments, the data width of the ultra-wide buses 40' is greater than 64 bits.

The control logic circuit 20 is electrically connected with the interface conversion logic circuit 30 through the original buses 40, and the interface conversion logic circuit 30 is electrically connected with the signal pads 50 through the original buses 40. The control logic circuit 20 is electrically connected with the micro pads 70 through the ultra-wide buses 40' and electrically connected with the power source pads 60 through the original buses 40 and the memory array 10.

The signal pads 50, the power source pads 60 and the micro pads 70 are formed on the memory die.

The bonding pads 80 are formed above the signal pads 50, the power source pads 60 and the micro pads 70, and are connected with the power source pads 60 and the micro pads 70.

The number of the bonding pads 80 is greater than or equal to a sum of the number of the micro pads 70 and the number of the power source pads 60. Each of the micro pads 70 may be connected with at least one of the bonding pads 80. Each of the source pads 60 may be connected with at least one of the bonding pads 80. To improve reliability, each of the power source pads 60 or each of the micro pads 70 may be electrically connected with a plurality of bonding pads 80.

To facilitate packaging a DRAM chip with a SoC chip, an area of the bonding pads 80 may be greater than an area of the micro pads 70, and the number and positions of the bonding pads 80 may be corresponding to the number and positions of bonding pads on the SoC chip.

It should be noted that, before the DRAM is formed, a yield of the memory wafer is tested, and only the memory wafer whose yield meets requirements can be used to form the DRAM provided in embodiments of the present disclosure.

Therefore, the yield of the formed DRAM may be ensured to be relatively high, such as 70% to 90%.

Figure 7:
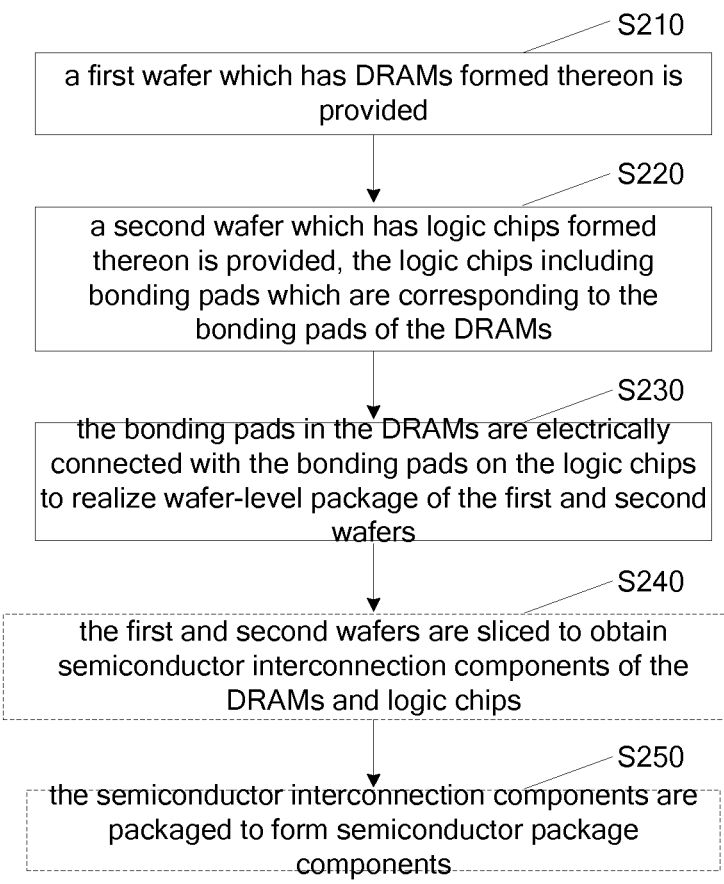
FIG. 7 illustrates a flow chart of a semiconductor package method according to an embodiment.

In an embodiment, a semiconductor package method is provided. FIG. 7 illustrates a flow chart of a semiconductor package method according to an embodiment. The method includes S210, S220, S230, S240 and S250.

In S210, a first wafer which has DRAMs formed thereon is provided. In some embodiments, the DRAMs are DRAMs having ultra-wide buses. Surfaces of the DRAMs have bonding pads formed thereon which are corresponding to bonding pads on logic chips. Ultra-wide data buses are formed in the DRAMs and led out from banks. The DRAMs may be formed by methods provided in above embodiments, which are not described in detail here.

In S220, a second wafer which has logic chips formed thereon is provided, the logic chips including bonding pads which are corresponding to the bonding pads of the DRAMs.

Figure 8:
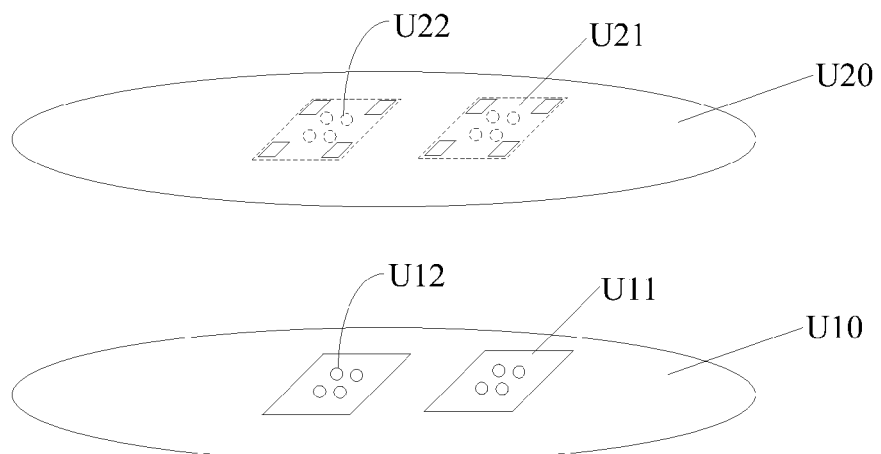
FIGS. 8 and 9 illustrate intermediate semiconductor structures obtained by the method shown in FIG. 7.

FIG. 8 illustrates the first and second wafers. Referring to FIG. 8, a DRAM U11 is formed on a first wafer U10, and bonding pads U12 are formed on a surface of the DRAM U11. A logic chip U21 is formed on a second wafer U20, and bonding pads U22 are formed on a surface of the logic chip U21. The number and positions of the bonding pads U12 of the DRAM U11 are corresponding to the number and positions of the bonding pads U22 on the logic chip U21.

Still referring to FIG. 7, in S230, the bonding pads in the DRAMs are electrically connected with the bonding pads on the logic chips to form wafer-level package of the first and second wafers. In some embodiments, the bonding pads in each DRAM on the first wafer are bonded and connected with the bonding pads on each logic chip on the second wafer correspondingly.

Figure 9:
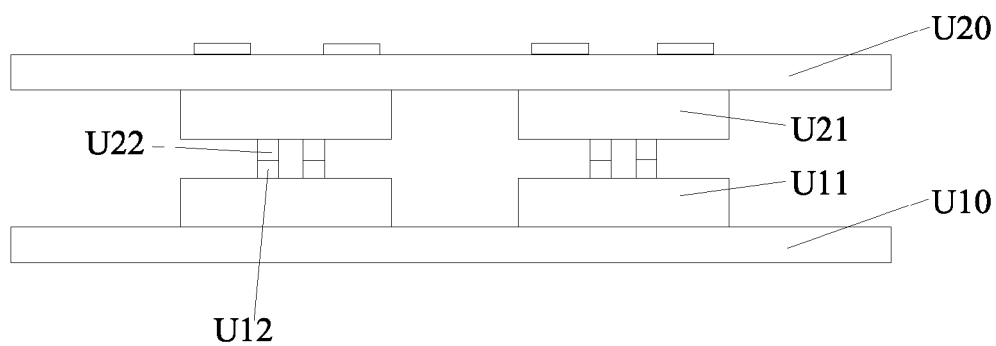

FIG. 9 illustrates a structure formed after the wafer-level package of the first and second wafers is formed. Referring to FIG. 9, the bonding pads U12 and the bonding pads U22 are bonded and connected with each other, thus, the DRAM U10 are electrically connected with the logic chip U21, which realizes the wafer-level package of the first wafer U10 and the second wafer U20.

Still referring to FIG. 7, optionally, S240 may be performed. In S240, the first and second wafers are sliced to obtain semiconductor interconnection components of the DRAMs and logic chips.

Those skilled in the art can understand that, the first and second wafers may be sliced by a method in existing techniques to obtain the semiconductor interconnection components, such as BGA package or stacked package, which is not limited in embodiments of the present disclosure and not described in detail here.

Still referring to FIG. 7, optionally, S250 may be performed. In S250, the semiconductor interconnection components are packaged to form semiconductor package components.

Those skilled in the art can understand that, the semiconductor interconnection components may be packaged by a method in existing techniques to form the semiconductor package components, such as BGA package or stacked package, which is not limited in embodiments of the present disclosure and not described in detail here.

Figure 10:
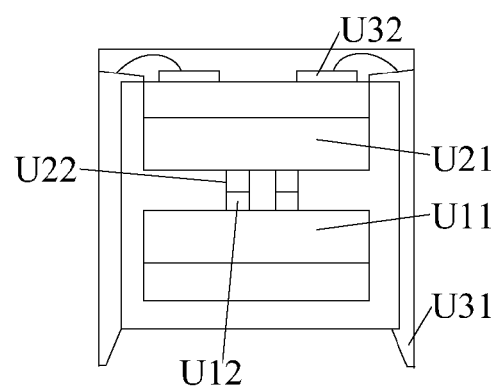
FIG. 10 illustrates a semiconductor structure formed by the method shown in FIG. 7.

FIG. 10 illustrates a semiconductor structure formed by the method shown in FIG. 7. Referring to FIG. 10, pins U31 on a surface of the DRAM U11 which opposites a surface of the DRAM U11 having the bonding pads U12 formed thereon are welded with pads U32 on a surface of the logic chip U21 which opposites a surface of the logic chip U21 having the bonding pads U22 formed thereon. After the welding, the whole structure is encapsulated to form the semiconductor package component.

In some embodiments, due to the DRAM having ultra-wide buses, a reading rate of the semiconductor package components may be improved, and a yield of the semiconductor package components may be ensured, which may further reduce manufacturing cost of the package method in embodiments of the present disclosure.

Accordingly, in an embodiment, a semiconductor package component is provided. Referring to FIG. 10, a structure of the semiconductor package component is illustrated. The semiconductor package component includes the DRAM U11, the logic chip U21 and the pins U31.

The DRAM U11 includes the bonding pads U12 formed on one surface of the DRAM U11.

The logic chip U21 includes the bonding pads U22 formed on one surface of the logic chip U21 and the pads U32 formed on another surface of the logic chip U21.

The pads U12 and the pads U22 may have a same number and a same area, and are bonded and connected to each other to realize electrical connection between the DRAM U11 and the logic chip U21.

The pads U32 are welded with the pins U31. The semiconductor package component may be assembled on a PCB through the pins U31.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure. Therefore, the protection scope of the present disclosure is subject to the scope defined by the claims.

What is claimed is:

1. A method for forming a dynamic random access memory (DRAM), comprising:
providing a memory wafer, where memory dies are formed on the memory wafer, a top metal layer is formed on the memory dies, power source pads, signal pads and micro pads are formed on the top metal layer, and an internal bus is led out from the memory dies to be electrically connected with the micro pads;
repairing the memory wafer;
after the repair, if a yield of the memory wafer is greater than or equal to a predetermined threshold, redistributing the micro pads to form bonding pads which are electrically connected with the micro pads and the power source pads.

2. The method according to claim 1, wherein the memory dies comprise a plurality sets of internal buses, where each set of the internal bus comprises a data bus and a control bus, and each set of the internal bus corresponds to one set or a plurality sets of memory arrays in the memory dies.

3. The method according to claim 1, wherein an area of the bonding pads is greater than an area of the micro pads.

4. The method according to claim 1, wherein the number of the bonding pads is greater than or equal to a sum of the number of the micro pads and the number of the power source pads.

5. The method according to claim 4, wherein each of the micro pads is connected with at least one of the bonding pads.

6. The method according to claim 4, wherein each of the power source pads is connected with at least one of the bonding pads.

7. The method according to claim 1, wherein redistributing the micro pads to form the bonding pads comprises:
- forming at least one metal layer above the memory wafer;
- forming the bonding pads on a top one of the at least one metal layer, where the number and positions of the bonding pads are corresponding to the number and positions of bonding pads on a logic chip; and
- connecting the bonding pads on the top one of the at least one metal layer with the micro pads and the power source pads.

8. The method according to claim 1, further comprising: turning off at least one selected from a physical interface logic, a serial-to-parallel conversion logic, a mode register and a delay phase-locked loop.

9. The method according to claim 1, further comprising: forming a test logic chip in a slicing groove of the memory wafer, the test logic chip being connected with the bonding chips.

10. The method according to claim 1, further comprising: if the yield of the memory wafer is less than the predetermined threshold, slicing the memory wafer to separate the memory dies, and packaging the memory dies individually.

11. A dynamic random access memory (DRAM), formed on a memory wafer, comprising:
- a memory die, which comprises a plurality sets of memory arrays and a plurality sets of internal buses, each set of the internal bus corresponding to at least one set of the plurality sets of memory arrays;
- power source pads, signal pads and micro pads formed on the memory die;
- bonding pads formed above the power source pads and the micro pads,
- where the bonding pads are connected with the power source pads and the micro pads, and the plurality sets of internal buses are connected with the micro pads.

12. The method according to claim 11, wherein an area of the bonding pads is greater than an area of the micro pads.

13. The method according to claim 11, wherein the number of the bonding pads is greater than or equal to a sum of the number of the micro pads and the number of the power source pads.

14. The method according to claim 13, wherein each of the micro pads is connected with at least one of the bonding pads.

15. The method according to claim 13, wherein each of the power source pads is connected with at least one of the bonding pads.

16. The method according to claim 13, wherein the number and positions of the bonding pads are corresponding to the number and positions of bonding pads on a logic chip.

17. A semiconductor package method, comprising:
- providing a first wafer which has DRAMs formed thereon, where the DRAMs are formed by the method according to claim 1;
- providing a second wafer which has logic ships formed thereon, where the logic chips comprise bonding pads which are corresponding to bonding pads in the DRAMs; and
- electrically connecting the bonding pads in the DRAMs with the bonding pads on the logic chips to form wafer-level package of the first and second wafers.

18. The method according to claim 17, wherein electrically connecting the bonding pads in the DRAMs with the bonding pads on the logic chips to form wafer-level package of the first and second wafers comprises: bonding and connecting the bonding pads in each DRAM on the first wafer with the bonding pads on each logic chip on the second wafer correspondingly.

19. The method according to claim 17, further comprising:
- after realizing the wafer-level package, slicing the first and second wafers to obtain semiconductor interconnection components which comprise the DRAMs and the logical chips; and
- packaging the semiconductor interconnection components to form semiconductor package components.

20. A semiconductor package component, comprising:
- the DRAM according to claim 11; and
- a logic chip which has bonding pads formed thereon,
- where the bonding pads on the logic chip are corresponding to and electrically connected with bonding pads in the DRAM.

\* \* \* \* \*